United States Patent [19]

Verner et al.

[11] Patent Number: 4,465,895
[45] Date of Patent: Aug. 14, 1984

[54] THERMOELECTRIC DEVICES HAVING IMPROVED ELEMENTS AND ELEMENT INTERCONNECTS AND METHOD OF MAKING SAME

[75] Inventors: Dalton R. Verner, Orchard Lake; Donald L. Heath, Leonard, both of Mich.

[73] Assignee: ECD-ANR Energy Conversion Company, Troy, Mich.

[21] Appl. No.: 499,998

[22] Filed: Jun. 1, 1983

[51] Int. Cl.³ ............................................. H01L 35/28
[52] U.S. Cl. .................................. 136/225; 136/201; 136/211; 136/212
[58] Field of Search ................ 136/201, 211, 212, 225

[56] References Cited

U.S. PATENT DOCUMENTS

| | | | |
|---|---|---|---|
| 3,632,451 | 1/1972 | Abbott | 136/212 |
| 3,781,176 | 12/1973 | Penn et al. | 136/201 |
| 4,011,104 | 3/1977 | Basiulis | 136/205 |
| 4,276,441 | 6/1981 | Wilson | 136/211 X |

*Primary Examiner*—Leland A. Sebastian
*Attorney, Agent, or Firm*—Lawrence G. Norris

[57] ABSTRACT

A new and improved thermoelectric device and a method of manufacturing same takes advantage of the anisotropy of the materials employed to provide a substantially increased power output over prior art devices. The individual thermoelectric elements are pressed using techniques such as those employed in powdered metallurgy and electrically coupled such that a current path is established through the elements in a direction substantially perpendicular to the direction of pressing.

The method and device of the present invention also achieve a substantially thinner device than was previously possible with no concomitant sacrifice in individual thermoelectric element integrity or increased resistance of the electrical connections between the individual thermoelectric elements. The individual thermoelectric elements are dimensioned such that each has a first dimension substantially greater than either its second or third dimensions. The individual elements are then electrically connected to one another in series along their first, greater dimensions so that the relationship between the length, cross-sectional area and resistivity of the electrical connections can be optimized.

42 Claims, 6 Drawing Figures

THERMOELECTRIC DEVICES HAVING IMPROVED ELEMENTS AND ELEMENT INTERCONNECTS AND METHOD OF MAKING SAME

BACKGROUND OF THE INVENTION

The present invention relates to new and improved thermoelectric devices for the generation of electricity.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new thermoelectric devices which provide more electricity.

An important part of the solution with respect to the development of permanent, economical energy conversion lies in the field of thermoelectrics wherein electrical power is generated by heat. It has been estimated that more than two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of polar ice caps with an attendant increase in sea level.

The efficiency of a thermoelectric device can be expressed in terms of a figure of merit (Z) for the material forming the device, the equation defining Z is:

$$Z = S^2 \sigma / K$$

where:

Z is expressed in units $\times 10^3$;
S is the Seebeck coefficient in $\mu V/°C$;
K is the thermal conductivity in $mW/cm\text{-}°C$; and
$\sigma$ is the electrical conductivity in $(\Omega\text{-}cm)^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_l$, the lattic component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi,Sb)_2Te_3$, PbTe, and Si-Ge. The $(Bi,Sb)_2Te_3$ materials are best suited for applications in the $-10°$ C. to $150°$ C. range with its best Z appearing at around $30°$ C. $(Bi,Sb)_2Te_3$ represents a continuous solid solution system in which the relative amount of Bi and Sb are from 0 to 100%. The Si-Ge material is best suited for high temperature applications in the $600°$ C. to $1000°$ C. range with a satisfactory Z appearing at above $700°$ C. The PbTe polycrystalline material exhibits its best figure of merit in the $300°$ C. to $500°$ C. range. None of these materials is well suited for applications in the $100°$ C. to $300°$ C. range. This is indeed unfortunate, because it is in this temperature range where a wide variety of waste heat applications are found. Among such applications are geothermal waste heat and waste heat from internal combustion engines in, for example, trucks, buses, and automobiles. Applications of this kind are important because the heat is truly waste heat. Heat in the higher temperature ranges must be intentionally generated with other fuels and therefore is not truly waste heat.

New and improved thermoelectric alloy materials have been discovered for use in the aforesaid temperature ranges. These materials are disclosed and claimed in copending U.S. application Ser. No. 412,306, filed August 27, 1982, now U.S. Pat. No. 4,447,277, in the names of Tumkur S. Jayadev and On Van Nguyen for NEW MUTLIPHASE THEREMOELECTRIC ALLOYS AND METHOD OF MAKING SAME, allowed Sept. 26, 1983, and U.S. application Ser. No. 414,917, filed Sept. 3, 1982 in the names of Tumkur S. Jayadev, On Van Nguyen, Jamie M. Reyes, Helen Davis and Michael W. Putty for NEW POWDER PRESSED THERMOELECTRIC MATERIALS AND METHOD OF MAKING SAME.

The thermoelectric materials there disclosed can be utilized in the device herein. These materials are not single phase crystalline materials, but instead, are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction. Contrary to conventional materials, the material is designed such that the grain boundaries define regions including conductive phases therein providing numerous electrical conduction paths through the bulk material for increasing electrical conductivity without substantially effecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforesaid referenced applications, the $S^2\sigma$ product for the figure of merit of these materials can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474, and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofore mentioned independently increased electrical conductivities. In contrast, the materials disclosed in the aforesaid referenced applications are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

A thermoelectric device generates electricity by the establishment of a temperature differential across the materials contained therein. The thermoelectric devices generally include elements of both p-type and n-type material. In the p-type material the temperature differential drives positively charged carriers from the hot side to the cold side of the elements, while in the n-type material the temperature differential drives negatively charged carriers from the hot side to the cold side of the elements.

Thermoelectric power conversion has not found wide usage in the past not only because of material limitations but also because of device limitations. Among the device limitations are bowing or warping of device substrates, loss of broad surface contact between the device and a heat exchanger when utilized in a thermoelectric system and temperature losses across the substrates.

Thermoelectric devices of the prior art use copper lead patterns placed upon a ceramic substrate for the attachment of thermoelectric elements thereto. In the manufacture of these devices, a second ceramic substrate having another copper lead pattern is sweated onto the thermoelectric elements. Due to the difference in the coefficient of thermal expansion between the ceramic substrates and the copper lead patterns, there occurs a bowing or warping of the substrates during the sweating operation which causes a number of related problems.

First, because of the warping of the substrates, it is difficult if not impossible to obtain a good thermal connection between the elements and the copper lead patterns of the substrates. Additionally, because the ceramic substrates are brittle, the bowing or warping, if severe enough, can cause cracking of the substrates and other physical degradation of the devices. Furthermore, to be employed in a thermoelectric system, the outer surfaces of the substrates must make intimate broad surface contact with a heat exchanger. The warping or bowing of the substrates also makes proper connection between the devices and a heat exchanger difficult.

To overcome these problems, the forces imparted to the substrates caused by the difference in the coefficients of thermal expansion between the copper lead patterns and the ceramic substrates are equalized by applying copper in substantially identical patterns as the lead patterns to the other side of the substrates. Unfortunately, the additional copper increases the material cost of the devices and adds extra processing steps to their manufacture. Furthermore, the degree of abatement of thermal stress obtained by this process is still not satisfactory.

During the operation of thermoelectric devices, a temperature differential is applied across the device to generate electricity. Due to the difference in the coefficient of thermal expansion between the substrates and the thermoelectric elements, loss of broad surface contact occurs between the device and the heat exchanger when utilized in a thermoelectric system. This loss of broad surface contact results in less heat transfer which translates to a lower temperature differential across the device, and lower efficiency of the device.

It has also been found that a substantial temperature drop occurs across the ceramic substrates. The voltage output and the current of a thermoelectric element is proportional to the temperature differential across the element. Therefore, the power is proportional to the square of the temperature differential, and any change in temperature differential across the elements has a substantial effect on the power output of the device. As a result, the temperature drop across the substrates reduces the temperature differential otherwise available to the elements for power generation. Further, the additional copper used to overcome the warping problems adds additional temperature losses across the substrates. These losses undesirably decrease the temperature differential across the thermoelectric elements from the temperature differential available across the devices thereby adversely decreasing the power output of the devices.

Because of these problems, thermoelectric devices of the prior art often failed during operation due to cracking of thermoelectric elements, loosening of electrical and thermal connections and fracture of the substrate. Furthermore, warpage and loss of broad surface contact results in lower heat transfer which translates into a lower temperature differential across the device and therefore, a lower overall efficiency.

In an attempt to overcome these problems, a substrateless device has been proposed. This device and method of fabrication thereof is disclosed and claimed in co-pending U.S. application Ser. No. 372,688, filed Apr. 28, 1982, in the name of Der-Jeou Chou for IMPROVED THERMOELECTRIC DEVICE AND METHOD OF MAKING SAME, allowed Mar. 7, 1984, which application is also incorporated herein by reference. The device disclosed therein has no substrates and no compensating elements. Consequently, thermal losses normally resulting from these components are eliminated. Furthermore, the disclosed device exhibits a lower degree of thermal stress because the thermoelectric generating elements are flexibly held together by a plurality of conductive interconnecting members and a potting compound filling the voids between the elements. This structure results in a device having a high degree of flexibility.

Two other important considerations which are often problematical in working with thermoelectric devices are the exact dimensions and configuration of thermal elements within a particular device. These are determined by a number of detailed design considerations. Not the least among these are the required poweroutput as well as the overall device dimensions. Some of the factors involved in these two considerations are discussed in, for example, Raag, U.S. Pat. No. 4,032,363, and Germano, U.S. Re-issue Pat. No. 30,652. In his discussion of some of the factors effecting these considerations, Raag notes that many thermoelectric materials do not have the mechanical strength required to allow them to be fashioned into thermoelectric elements with the extreme length to cross sectional element area ratio required of devices producing high voltages. Therefore, a situation is often presented wherein the only truly feasible way to manufacture a thermoelectric device thin enough for the physical limitations of a particular application is to make the electrical connections between individual thermoelectric elements as thin as possible. However as noted in Germano, supra, it is important that the connections between the individual thermoelectric elements be of negligible electrical resistance in relation to the elements themselves. Furthermore, bearing in mind the basic electrical relation $R = \rho l/A$, it is obvious that one cannot merely make the connections thinner without adversely affecting, i.e. increasing, the resistance of the connection. Indeed, Raag, in the course of his discussion of one alternative method for electrical interconnection of the thermoelectric elements in a thermoelectric device, says at the bottom of column 16 and top of column 17, "The electrical resistivity of the metal should be quite low, but any deficiency in this regard can be effectively eliminated by the use of thicker metal layers." Obviously, while this deals quite effectively with the problem of the resistivity of the connections between the elements, it is clearly counter productive in terms of minimizing overall device size.

The second consideration noted above, the power output of the device, is also discussed in Raag. He notes that the power output of a device generally decreases with an increasing ratio of individual thermoelectric element length to cross sectional area. However, by increasing the individual thermoelectric element length to cross sectional area ratio a substantially thinner device can be achieved. So, in the use of prior art thermoelectric devices, there is often a direct conflict between the design considerations in making a thinner device versus the considerations required for a given power output and device efficiency.

As will be demonstrated hereinafter, the new and improved thermoelectric devices of the instant invention overcome the problems of the prior art. A thinner device is achieved while increasing power output substantially.

SUMMARY OF THE INVENTION

The present invention provides a new and improved thermoelectric device for the generation of electricity and a method of manufacturing same. More specifically, one aspect of the invention provides thermoelectric elements which take advantage of the anisotropy of the materials used to provide a substantially increased power output over prior art devices. The individual thermoelectric elements are pressed using techniques such as those employed in powder metallurgy and electrically coupled together to establish a current path through the elements in a direction substantially perpendicular to the direction of pressing.

In accordance with another aspect of the invention, there is provided a thermoelectric device and method for making same which achieves a substantially thinner device than was possible with prior art configurations, while not sacrificing individual thermoelectric element integrity or increasing the resistance of the electrical connections between the individual thermoelectric elements. This is accomplished by manufacturing a thermoelectric element which has a first dimension substantially greater than its second or third dimensions. The individual elements are electrically connected to one another in series along their first, greater dimensions, as opposed to the standard practice of the prior art of connecting the individual elements at their ends. By electrically interconnecting the thermoelectric elements along their first, longest dimension, the relationship between resistance, resistivity, length and cross sectional area of the connector can be taken advantage of to maintain the smallest resistance possible while still connecting the elements in series so as to achieve a particular desired device output voltage.

DESCRIPTION OF THE PREFERRED EMBODIMENTS

Figure 1:
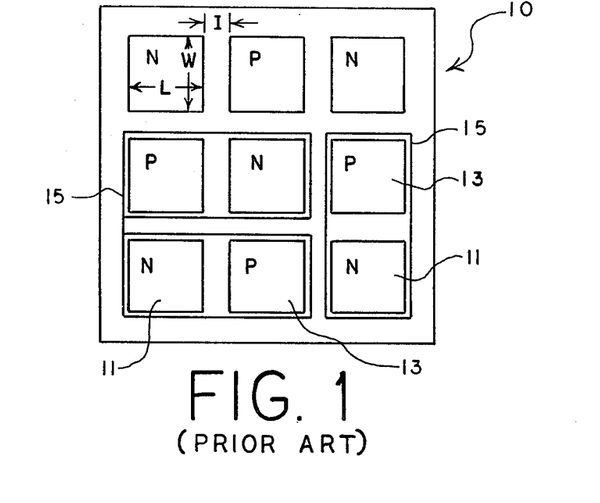
FIG. 1 is a partial, simplified, diagrammatic view of a prior art thermoelectric device.

FIG. 1 is a simplified, diagrammatic view of a prior art thermoelectric device 10. Device 10 generates electricity in response to the establishment of a temperature gradient thereacross. It includes alternating n-type and p-type thermoelectric elements 11 and 13, each having a length l width w and space i between elements. The temperature differential drives flux through elements 11 and 13. In the n-type elements 11 the temperature differential drives negative carriers from the hot side to the cold side of device 10. In the p-type elements 13 the temperature differential drives positive carriers from the hot side to the cold side. It is this movement of positive and negative carriers which generates electricity.

For purposes of this discussion we shall assume that elements 11 and 13 of device 10 are so assembled that they are thermally in parallel and electrically in series with one another. Each pair consisting of one n-type element 11 and one p-type element 13 are electrically connected at one end by an electrical connecting strap 15 which is shown somewhat expanded in FIG. 1 for ease of illustration but which has, in fact, a length equal to 2l+i and a width w. Device 10 also has further electrical connecting straps (not shown) at the opposite end of thermoelectric elements 11 and 13, each strap connecting the end of n-type element 11 of each pair of electrically connected thermal elements 11 and 13 to the p-type element 13 of the next adjacent pair of electrically connected thermoelectric elements 11 and 13. In this way all thermoelectric elements 11 and 13 of device 10 are connected electrically in series. Clearly, to achieve a maximum power output for device 10, connecting strap 15 should have a resistance as low as possible. The resistance of connecting strap 15 is governed by the equation:

$$R = \rho l / A$$

Where:
R is the resistance in ohms;
$\rho$ is the resistivity in ohm-centimeters;
l is the length in centimeters;
A is the cross sectional area of the strap in square centimeters.

Clearly, to minimize the resistance of connecting strap 15, one could simply increase the thickness of the strap which would increase the cross sectional area and hence lower the electrical resistance. However, if one important design consideration in the particular application is to minimize as much as possible the overall dimensions of device 10, and in doing so one were to consider making strap 15 as thin as possible, clearly the power output would suffer. The thinner connecting strap 15 would result in a smaller cross sectional area which in turn would cause a concomitant increase in resistance.

Figure 2:
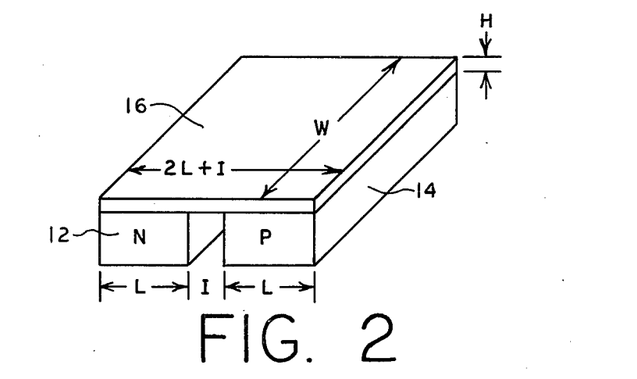
FIG. 2 is a simplified diagrammatic view of two thermoelectric elements electrically coupled together as contemplated by the present invention.

Referring now more particularly to FIG. 2, there is illustrated an n-type thermoelectric element 12, a p-type thermoelectric element 14 and an electrical connecting strap 16 configured in accordance with the present invention. Note that in all figures like reference numerals denote like components. In this configuration, thermoelectric elements 12 and 14 are connected by connecting strap 16 along their longest dimension rather than at their ends. For purposes of calculation of the resistance of the electrical connecting strap 16, note that the length remains the same, 2l+i and the resistivity remains constant, it being a property of the material used to form connecting strap 16. However, it can be noted that the width, w, of strap 16 is substantially larger than it would have been if connected to the ends of elements 12 and 14 as in the prior art. This allows the length to cross sectional area ratio, and therefore the resistance of strap 16, to remain the same while permitting the thickness of strap 16 to be substantially decreased. As a final result, a thinner device can be produced.

For example, if strap 16 is four times as wide (dimension w), the length to cross sectional area ratio of connecting strap 16 remains the same as that described in FIG. 1 even though strap 16 is one-fourth as thick. In other words, in accordance with this embodiment of the present invention, connecting strap 16 is one-fourth as thick as in the prior art configuration with no concomitant increase in resistance. Clearly, the relative dimensions referred to in the example above are merely exemplary and should in no way be construed to limit the present invention.

Figure 3:
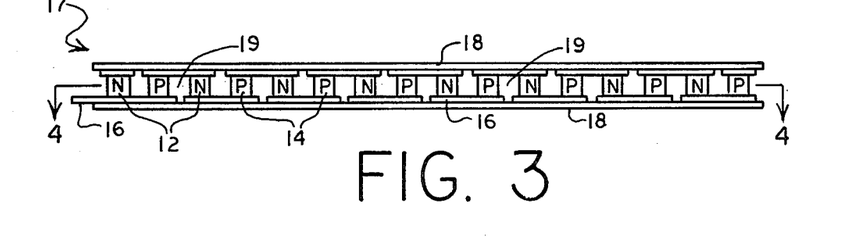
FIG. 3 is a partial side view of a thermoelectric device embodying the configuration of electrical connection illustrated in FIG. 2.

FIG. 3 is a side view of a thermoelectric device 17 employing the configuration of electrical interconnection of thermoelectric elements 12 and 14 as described with respect to FIG. 2 above.

Device 17 as illustrated includes, along with thermoelectric elements 12 and 14 and straps 16 as described above, substrates 18 over the straps 16 and a compound 19, such as a ceramic potting compound, which fills the voids between elements 12 and 14. Compound 19 has qualities of high electrical and thermal resistivity to insulate the elements and protect them from contamination. Compound 19 also acts to absorb thermal expansion of device 17 during its use.

Substrate 18 can be a thick film ceramic such as ESL M4906 manufactured by ElectroScience Laboratories, Inc. or the like. The thick film ceramic has a high electrical resistivity to electrically insulate the connecting straps 16 when, for instance, it is employed in conjunction with a heat exchanger. It also has a high thermal conductivity to maximize the temperature differential across elements 12 and 14 for a given temperature differential across device 17. It should be noted however that for certain applications a device without substrates may be employed as well as a device having a bottom substrate only with the electrically connected tops of the element "floating" and still be well within the scope of the present invention. A substrateless device and method of making same is disclosed and claimed in the aforementioned co-pending U.S. application Ser. No. 372,688, filed Apr. 28, 1982, for IMPROVED THER- MOELECTRIC DEVICE AND METHOD OF MAKING SAME, allowed Mar. 7, 1984.

Another method and apparatus for assembling thermoelectric devices which can effectively utilize the improvements of the present invention is disclosed and claimed in U.S. Ser. No. 373,120, filed Apr. 29, 1982, for AN IMPROVED METHOD AND APPARATUS FOR MANUFACTURING THERMOELECTRIC DEVICES, allowed Feb. 22, 1984, which application is assigned to the assignee of the present invention and incorporated herein by reference.

Figure 4:
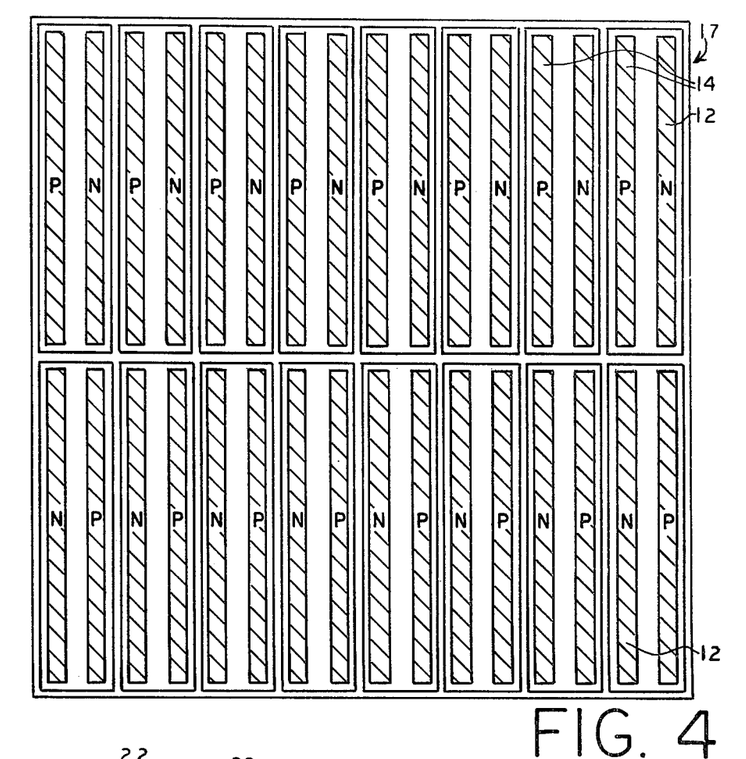
FIG. 4 is a cross sectional view of the thermoelectric device of FIG. 3 taken along lines 4—4 of FIG. 3.

Reference is now made more particularly to FIG. 4 which is a cross sectional view of the thermoelectric device 17 of FIG. 3 taken along lines 4—4 thereof. The device 17 includes sixteen n-type elements 12 and sixteen p-type elements 14 by way of example, but any number of p-type and n-type elements will suffice. A representative composition utilized for p-type elements 14 comprises from about 10 to 20 percent bismuth, about 20 to 30 percent antimony, about 60 percent tellurium, and less than 1 percent silver. This material and others usable as p-type elements are disclosed and claimed in co-pending U.S. application Ser. No. 414,917, filed Sept. 3, 1982, for NEW POWDER PRESSED THERMOELECTRIC MATERIALS AND METHOD OF MAKING SAME. The n-type elements 12 may comprise about 40 percent bismuth, about 54 percent tellurium and about 6 percent selenium.

Figures 5, 6:
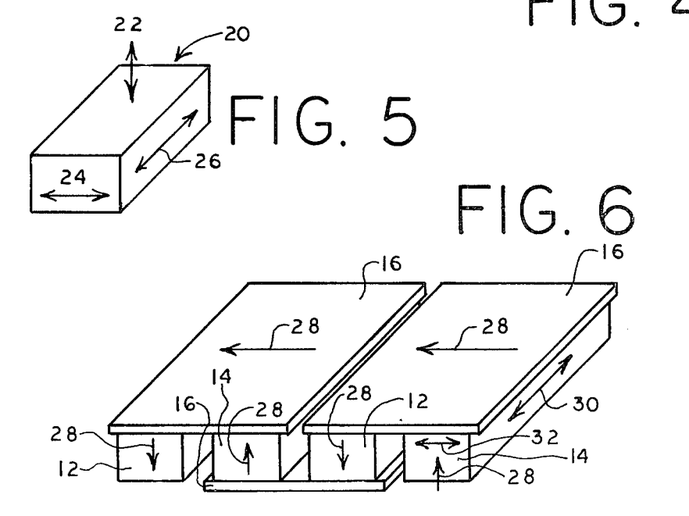
FIG. 5 is a perspective view of a single thermoelectric element illustrating further aspects of the present invention.
FIG. 6 is a partial perspective view of a plurality of thermoelectric elements interconnected in accordance with the present invention.

Referring now more particularly to FIGS. 5 and 6, there is illustrated a thermoelectric element 20 and a plurality of thermoelectric elements 12 and 14 respectively embodying further aspects of the present invention, notably, the anisotropy of the thermoelectric materials employed. Anisotropic materials are those having different physical properties, such as conductivity, elasticity, etc., depending on the direction of measurement of the particular property in question. The inventors have found that the thermoelectric materials disclosed and claimed in the aforementioned copending U.S. application Ser. No. 414,917 are anisotropic with respect to their power output. In other words, if these materials are pressed to form thermoelectric elements and the elements are then electrically connected in such a way as to have a current flow in a direction different from, and preferably perpendicular to, the direction of pressing, the power output is substantially greater than the power output measured when the current flows in substantially the same direction as pressing. In fact, the inventors have measured an increase of up to 30 to 35% in the power output when the anisotropy is taken advantage of.

These thermoelectric materials can be utilized in the device herein. They are not single phase crystalline materials, but instead are disordered materials. Further, these materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction.

Contrary to conventional materials, these materials are designed such that the grain boundaries define regions including conductive phases therein providing numerous electrical conduction paths through the bulk material for increasing electrical conductivity without substantially affecting the thermal conductivity. In essence, these materials have all of the advantages of polycrystalline materials in desirably low thermal conductivities and crystalline bulk Seebeck properties. However, unlike the conventional polycrystalline materials, these disordered multiphase materials also have desirably high electrical conductivities. Hence, as disclosed in the aforementioned application No. 414,917, the $S^2\sigma$ product for the figure of merit of these materials can be independently maximized with desirably low thermal conductivities for thermoelectric power generation.

Referring now more particularly to FIG. 5, there is illustrated an individual thermoelectric element 20. If element 20 is formed from powder which is pressed in the direction of arrow 22 and later electrically connected so that current flows through the thermal element either in the direction of arrow 24 or arrow 26, the power output will be increased by virtue of the inherent anisotropy. Similarly, if thermal element 20 is pressed in the direction of arrow 24, current flowing in the direction of arrows 22 or 26 will exhibit the anisotropic effect as will current flowing in the direction of arrows 22 or 24 when arrow 26 indicates the direction of pressing.

FIG. 6 illustrates a partial perspective view of a plurality of thermoelectric elements interconnected in accordance with the present invention as discussed above. Note that the individual n and p-type thermoelectric elements 12 and 14 are connected electrically between their long axes by electrical connecting straps 16. This configuration allows substantially thinner devices to be made as previously discussed by employing substantially thinner connecting straps 16 while maintaining low resistance in the straps.

FIG. 6 also illustrates how the anisotropic effect discussed above can be taken advantage of. Assuming that the individual thermoelectric elements 12 and 14 were pressed from powders in the direction of arrows 30 or 32, and then electrically connected by strap 16 as indicated in FIG. 6, current would flow through the device in the direction indicated by arrows 28. Because of the anisotropic effect the power output would be increased substantially. The configuration illustrated and discussed above with respect to FIG. 6 is easily adapted into a thermoelectric device such as device 17 of FIG. 3.

Modifications and variations of the present invention are possible in light of the above teachings. Note for example that the particular dimensions of an individual thermoelectric element are not necessarily crucial to the present invention. For example, one may find it advantageous to employ a rectangular thermoelectric element having one dimension between approximately ten and twenty times greater than either of the other two dimensions. One preferred ratio of dimensions for practicing the present invention would be 1:1.5:16. As the element would most likely be pressed along either of the two smaller dimensions, the use of a thermoelectric element having all dissimilar dimensions would simplify the later identification of the direction of pressing. This would in turn facilitate electrical connection in a direction conducive to maximum anisotropic effects by, for instance, rotating the element ninety degrees from the direction of pressing before electrically connecting the elements together in the thermoelectric device. Also a thermoelectric element having this or a similar ratio of dimensions could easily be electrically connected to another similar thermoelectric element along their long axes to facilitate the use of a thinner connecting strap and therefore yielding a thinner device.

It should also be noted that a thermoelectric device having any number of thermoelectric elements is well within the spirit of the present invention. It is therefore to be understood that within the scope of the appended claims the invention may be practiced otherwise than as specifically described.

We claim:

1. In a thermoelectric device including at least two thermoelectric elements formed from powders compressed in a first direction, and coupling means for establishing a current path through said elements; the improvement comprising:
said elements and said coupling means being arranged for establishing said current path through said elements in a second direction substantially perpendicular to said first direction.

2. The thermoelectric device as defined in claim 1 wherein said coupling means includes a first set of conducting plate segments, each segment having an inner surface, and a second set of conducting plate segments, each segment having an inner surface, said second set of plate segments spaced from said first set of plate segment inner surfaces.

3. The thermoelectric device as defined in claim 2 wherein said at least two thermoelectric elements are disposed between said first and second conducting plate segments and are fastened to said inner surfaces.

4. The thermoelectric device as defined in claim 3 wherein two thermoelectric elements of said elements are fastened to one conducting plate segment of one set of conducting plate segments and each element of said two thermoelectric elements is fastened to a conducting plate segment of the other set of said conducting plate segments.

5. The thermoelectric device as defined in claim 4 wherein a current path is established through said coupling means and is in a direction substantially parallel to said first direction of pressing.

6. The thermoelectric device as defined in claim 5 wherein said thermoelectric elements have a major surface which is substantially parallel to said first direction of pressing.

7. The thermoelectric device as defined in claim 6 wherein said thermoelectric elements are fastened to said conducting plate along said major surface to establish said current path in said second direction.

8. The thermoelectric device as defined in claim 1 wherein a current path is established through said coupling means and is in a direction substantially perpendicular to said first direction of pressing.

9. The thermoelectric device as defined in claim 8 wherein said thermoelectric elements have a major surface which is substantially parallel to said first direction of pressing.

10. The thermoelectric device as defined in claim 9 wherein said coupling means includes at least one conducting plate segment and wherein said thermoelectric elements are fastened to said conducting plate along said major surface to establish said current path in said second direction.

11. In a thermoelectric device including at least two thermoelectric elements, and coupling means for coupling said elements electrically in series and thermally in parallel; the improvement comprising:
said at least two thermoelectric elements having at least a first dimension and a second dimension, said first dimension being greater than said second dimension; and
said coupling means being arranged for electrically coupling said at least two thermoelectric elements between said first dimensions.

12. The thermoelectric device as defined in claim 11 wherein said first dimension is between approximately ten and twenty times greater than said second dimension.

13. The thermoelectric device as defined in claim 12 wherein said first dimension is approximately sixteen times greater than said second dimension.

14. The thermoelectric device as defined in claim 13 wherein said coupling means includes a first set of conducting plate segments, each segment having an inner surface, and a second set of conducting plate segments, each segment having an inner surface, said second set of plate segments spaced from said first set of plate segment inner surfaces.

15. The thermoelectric device as defined in claim 14 wherein said at least two thermoelectric elements are disposed between said first and second conducting plate segments and are fastened to said inner surfaces.

16. The thermoelectric device as defined in claim 15 wherein two thermoelectric elements of said elements are fastened to one conducting plate segment of one set of conducting plate segments and each element of said two thermoelectric elements is fastened to a conducting plate segment of the other set of said conducting plate segments.

17. In a method of making a thermoelectric device including compressing a powder along a first direction to form at least two thermoelectric elements, the improvement comprising:
coupling said thermoelectric elements together to establish a current path through said thermoelectric elements in a second direction substantially perpendicular to said first direction.

18. The method as defined in claim 17 including the further step of providing a first set of conducting plate segments, each segment having an inner surface, and a second set of conducting plate segments, each segment having an inner surface, said second set of plate segments spaced apart from said first set of plate segment inner surfaces.

19. The method as defined in claim 18 wherein said step of coupling said thermoelectric elements together includes fastening two thermoelectric elements of said elements to one conducting plate segment of one set of conducting plate segments and fastening each element of said two thermoelectric elements to a conducting plate segment of the other set of said conducting plate segments.

20. The method as defined in claim 19 wherein said step of fastening said thermoelectric elements to said conducting plate segments includes fastening said plate segments so that the current path through said segments is substantially parallel to said first direction of pressing.

21. The method as defined in claim 20 wherein said step of compressing said powder to form said thermoelectric elements includes compressing said powder so that said elements have a major surface which is substantially parallel to said first direction.

22. The method as defined in claim 21 wherein said step of fastening said thermoelectric elements to said conducting plate segments includes fastening said thermoelectric elements along their major surface to establish a current path through said elements in said second direction.

23. The method as defined in claim 19 wherein said step of fastening said thermoelectric elements to said conducting plate segments includes fastening said plate segments so that the current path through said segments is substantially perpendicular to said first direction of pressing.

24. The method as defined in claim 23 wherein said step of compressing said powder to form said thermoelectric elements includes compressing said powder so that said elements have a major surface which is substantially parallel to said first direction.

25. The method as defined in claim 24 wherein said step of fastening said thermoelectric elements to said conducting plate segments includes fastening said thermoelectric elements along their major surface to establish a current path through said elements in said second direction.

26. In a method of making a thermoelectric device including compressing a powder along a first direction to form at least two thermoelectric elements and electrically coupling said elements to one another, the improvement comprising:
compressing said powder such that said thermoelectric elements have at least a first dimension and a second dimension, said first dimension being greater than said second dimension; and,
coupling said thermoelectric elements to one another between said first dimensions.

27. The method of claim 26 wherein said step of compressing said powder such that said first dimension is greater than said second dimension includes compressing said powder such that said first dimension is approximately ten to twenty times said second dimension.

28. The method as defined in claim 27 wherein said step of compressing said powder such that said first dimension is greater than said second dimension includes compressing said powder such that said first dimension is approximately sixteen times greater than said second dimension.

29. The method as defined in claim 26 including the further step of providing a first set of conducting plate segments, each segment having an inner surface, and a second set of conducting plate segments, each segment having an inner surface, said second set of plate segments spaced apart from said first set of plate segment inner surfaces.

30. The method as defined in claim 29 wherein said step of coupling said thermoelectric elements together includes fastening two thermoelectric elements of said elements to one conducting plate segment of one set of conducting plate segments and fastening each element of said two thermoelectric elements to a conducting plate segment of the other set of said conducting plate segments.

31. In a thermoelectric device including at least two thermoelectric elements formed from powders compressed in a first direction and coupling means for establishing a current path through said elements, the improvement comprising:
said at least two thermoelectric elements having at least a first dimension and a second dimension, said first dimension being greater than said second dimension;
said coupling means being arranged for electrically coupling said at least two thermoelectric elements between said first dimensions; and
said elements and said coupling means being arranged for establishing said current path through said elements in a second direction substantially perpendicular to said first direction.

32. The thermoelectric device as defined in claim 31 wherein said coupling means includes a first set of conducting plate segments, each segment having an inner surface, and a second set of conducting plate segments, each segment having an inner surface, said second set of plate segments spaced from said first set of plate segment inner surfaces.

33. The thermoelectric device as defined in claim 32 wherein said at least two thermoelectric elements are disposed between said first and second conducting plate segments and are fastened to said inner surfaces.

34. The thermoelectric device as defined in claim 33 wherein two thermoelectric elements of said elements are fastened to one conducting plate segment of one set of conducting plate segments and each element of said two thermoelectric elements is fastened to a conducting plate segment of the other set of said conducting plate segments.

35. The thermoelectric device as defined in claim 33 wherein a current path is established through said coupling means and is in a direction substantially parallel to said first direction of pressing.

36. The thermoelectric device as defined in claim 35 wherein said thermoelectric elements have a major surface which is substantially parallel to said first direction of pressing.

37. The thermoelectric device as defined in claim 36 wherein said thermoelectric elements are fastened to said conducting plate along said major surface to establish said current path in said second direction.

38. The thermoelectric device as defined in claim 34 wherein said current path through said coupling means is in a direction substantially perpendicular to said first direction of pressing.

39. The thermoelectric device as defined in claim 38 wherein said thermoelectric elements have a major surface which is substantially parallel to said first direction of pressing.

40. The thermoelectric device as defined in claim 39 wherein said thermoelectric elements are fastened to said conducting plate along said major surface to establish said current path in said second direction.

41. The thermoelectric device as defined in claim 34 wherein said first dimension is between approximately ten and twenty times greater than said second dimension.

42. The thermoelectric device as defined in claim 41 wherein said first dimension is approximately sixteen times greater than said second dimension.

* * * * *

UNITED STATES PATENT AND TRADEMARK OFFICE
CERTIFICATE OF CORRECTION

PATENT NO. : 4,465,895
DATED : August 14, 1984
INVENTOR(S) : Dalton R. Verner & Donald L. Heath It is certified that error appears in the above-identified patent and that said Letters Patent is hereby corrected as shown below:

Column 1, line 40, delete "$Z=(S^2\sigma/K$" and insert --$Z=S^2\sigma/K$--.

Column 2, line 41, delete "THEREMOELECTRIC" and insert --THERMOELECTRIC--.

Column 8, line 64, delete "element" and insert --elements--.

Signed and Sealed this

Second Day of April 1985

[SEAL]

Attest:

DONALD J. QUIGG

Attesting Officer      Acting Commissioner of Patents and Trademarks